United States Patent [19]
Eastin et al.

[11] Patent Number: 5,150,041
[45] Date of Patent: Sep. 22, 1992

[54] OPTICALLY ALIGNABLE PRINTED CIRCUIT BOARD TEST FIXTURE APPARATUS AND ASSOCIATED METHODS

[75] Inventors: Steven M. Eastin, Cypress; Ivan W. Byford, Dayton, both of Tex.

[73] Assignee: Compaq Computer Corporation, Houston, Tex.

[21] Appl. No.: 719,313

[22] Filed: Jun. 21, 1991

[51] Int. Cl.⁵ .............................................. G01R 13/02
[52] U.S. Cl. .............................. 324/158 F; 324/158 P
[58] Field of Search ............... 324/158 F, 158 P, 72.5, 324/73.1; 356/400; 358/107

[56] References Cited

U.S. PATENT DOCUMENTS

| | | | |
|---|---|---|---|
| 4,786,867 | 11/1988 | Kamatsu | 324/158 F |
| 4,820,975 | 4/1989 | Diggle | 356/400 |
| 4,856,904 | 8/1989 | Akagawa | 356/400 |

*Primary Examiner*—Ernest F. Karlsen
*Attorney, Agent, or Firm*—Konneker & Bush

[57] ABSTRACT

A test fixture for electrically testing the opposite sides of a printed circuit board is operative to support the circuit board in a pre-test position in which the board is positioned between and parallel to upper and lower probe structures. The test fixture is provided with a mechanical drive system that selectively functions to downwardly move the supported circuit board and the top probe structure to operative test positions thereof in which electrically conductive probe members on the top and bottom probe structures are brought into operative engagement with test contact points on the top and bottom sides of the circuit board, the probe members being suitably connected to an electrical test and analysis circuit. Horizontal misalignments between the test contact points and their associated probe members are detected by an optical position sensing and adjustment system which responsively functions to shift the circuit board and the top probe structure in horizontal planes to automatically assure precise contact point/probe member engagement alignment.

19 Claims, 6 Drawing Sheets

OPTICALLY ALIGNABLE PRINTED CIRCUIT BOARD TEST FIXTURE APPARATUS AND ASSOCIATED METHODS

BACKGROUND OF THE INVENTION

1. Field of the Invention

The present invention relates generally to test fixture apparatus for electrically testing printed circuit boards and the like, and more particularly relates to apparatus and methods utilized to properly align the printed circuit board being tested with the test probe portion of the overall fixture structure.

2. Description of Related Art

The often complex internal circuitry in printed circuit boards and the like is conventionally tested by forming a spaced series of electrically conductive test contact points or "pads" on one side of the board, the contact points being operatively connected in a predetermined manner to the internal circuitry to be electrically tested for continuity and proper operation. The circuit board is positioned on a vertically movable top plate structure disposed within a test fixture, and is maintained in appropriate horizontal alignment with the top plate structure by means of a plurality of upwardly projecting tooling pins secured to the top plate and extending through corresponding alignment holes formed in the circuit board.

With the circuit board in place within the test fixture, a vacuum force is exerted on the board to downwardly move the top plate structure and draw the board into adjacency with a fixed probe structure having a spaced series of upwardly projecting resilient test pins, commonly referred to as "pogo" pins, which are intended to be in horizontal alignment with the board test contact points. As the circuit board under test reaches a lower limit position thereof within the test fixture, the pogo pins engage and are downwardly compressed by the test contact points. The pogo pins are appropriately connected to a suitable test and analysis circuit which operates to receive and analyze electrical test signals emanating from the contact points and indicative of the correctness and operativeness of the board's printed circuitry. After this testing is completed, the vacuum force is terminated and the top plate structure, along with the circuit board mounted thereon, is upwardly returned to its starting position, and the now-tested circuit board is removed and replaced with the next circuit board to be tested.

This conventional use of a vacuum driving force and the tooling pin circuit board mounting alignment method just described has proven to be quite rugged and reliable, providing satisfactory test results over the years in conjunction with printed circuit boards in a variety of sizes and circuitry configurations. However, as the test point "densities" of circuit boards (i.e., the number of test contact points per area unit) increase, and the sizes of the individual test contact points decrease, the suitability of each of these conventional fixturing movement and alignment techniques markedly diminishes.

For example, in modern high density circuit boards, it is not uncommon for their test contact points to be less than 10 mils in diameter and, in at least some locations on the board, be in extremely close proximity to one another. This high density contact point orientation, and miniaturization of the contact points themselves, significantly heightens the adverse effects of even rather minuscule misalignment between the test contact points and the associated probe structure with which they are to be brought into operative contact.

In the conventional circuit board alignment and movement method generally described above, this undesirable misalignment stems from two primary causes—the tooling pins and the vacuum force used to move the board under test downwardly toward the pogo pin-based probe structure. Specifically, after a great number of circuit boards are tested and removed from a particular test fixture, the tooling pins used to hold the boards in a precisely aligned orientation begin to wear along their side surfaces, resulting in a slightly looser fit between the pins and successive groups of boards being tested. Particularly in the case of high density circuit boards having tiny, closely spaced test contact points, even a slight amount of alignment "play" caused by eventual tooling pin side surface wear can cause various ones of the pogo pins to miss their intended contact point targets as the circuit board reaches the pins.

The vacuum force exerted on the circuit board to draw it downwardly toward the probe structure often tends to slightly bow the board, particularly in a central portion thereof, thus horizontally shifting some of the test contact points and compounding the misalignment problem caused by surface wear on the tooling pins. This misalignment of the test contact points tends to be even more serious in test fixtures designed to simultaneously engage test contact points on opposite sides of the circuit board being tested.

It can be readily seen from the foregoing that, particularly in the case of high test point density printed circuit boards, the provision of test fixture apparatus having improved circuit board alignment control capabilities would be highly desirable. It is accordingly an object of the present invention to provide improved test fixture apparatus, and related test methods, having such enhanced circuit board alignment control capabilities.

SUMMARY OF THE INVENTION

In carrying out principles of the present invention, in accordance with preferred embodiments thereof, improved electrical circuit board test fixture apparatus is provided which uniquely incorporates therein an alignment system that functions to sense and responsively adjust the relative orientation between the circuit board being tested and an associated probe structure of the fixture apparatus prior to the board test contact points being brought into operative contact with the probe structure.

From a broad perspective, the improved test fixture apparatus of the present invention comprises a probe structure having a side portion facing generally in a direction parallel to a first axis extending therethrough, the probe structure having a spaced series of electrically conductive probe members thereon which are alignable and operatively engageable with the circuit board test contact points, and are connectable to a conventional electrical test and analysis circuit. The circuit board is supported in an axially spaced relationship with the probe structure, with the circuit board side surface facing the probe structure side portion.

According to an important feature of the present invention, alignment adjustment means are provided for detecting a misalignment between the probe members and the test contact points on the supported circuit board and automatically creating a relative positional shift between the test contact points and the probe members to bring them into precise alignment. A mechanical drive system is provided for selectively creating relative axial movement between the probe structure and the circuit board support structure in a manner creating an operative engagement between the relatively shifted test contact points and probe members.

In an analog embodiment thereof, the alignment adjustment means comprise a spaced plurality of reflective target members secured to the circuit board side surface, and a plurality of four quadrant photoconductors secured to the probe structure. The photoconductors are operative to direct beams of light against the board targets, receive the light reflected from the targets, and output signals indicative of the intensity of the reflected light received by the various quadrants of each photoconductor.

These output signals are transmitted to bridge balancing circuitry which compares the quadrant output signals from each photoconductor and responsively generates position adjustment signals. The position adjustment signals are in turn transmitted to motor means which effect the aforementioned relative positional shift between the circuit board and probe structure in the event that the quadrant output signals are collectively indicative of a misalignment between the circuit board contact points and the probe members.

In a digital embodiment thereof, the alignment adjustment means include optical lens means secured to the probe structure and positioned thereon to receive light reflected from the target members. Reflected light received by these lens means is transmitted to multi-pixel transducers and converted to video output signals which, in turn, are transmitted to a frame grabber incorporated in a computer in the memory of which predetermined reference frame patterns are stored.

The computer compares the actual frame patterns to the stored reference frame patterns and responsively outputs variance signals which are utilized to control the aforementioned motor means to effect a positional shift between the circuit board and the probe structure when a misalignment between the test contact points and their associated probe members.

The probe members in one embodiment of the fixture apparatus are resilient, electrically conductive test pins, and in another embodiment are resiliently deformable, electrical contact members imbedded in a resilient pad member defining a side portion of the probe structure which may be brought into operative engagement with the test contact points.

According to another feature of the present invention, either the analog or digital version of the optical alignment adjustment means is incorporated into test fixture apparatus adapted to simultaneously test the opposite sides of a printed circuit board having spaced series of test contact points on both of such opposite sides. Support means are provided for supporting the circuit board between top and bottom probe structures each having spaced series of probe members thereon.

Spaced pluralities of reflective target members are appropriately mounted on the opposite sides of the circuit board, and receiving portions of the optical alignment system are mounted on both of the top and bottom probe structures. The position correcting output signals from these receiving portions are utilized to drive motor means associated with the support means and the top probe structure to shift the circuit board in a first horizontal plane relative to the bottom probe structure, and to shift the top probe structure in a second horizontal plane relative to the circuit board.

The top probe structure and the circuit board to be tested are each preferably supported for movement relative to the bottom probe structure, and relative to one another, rotationally about a vertical axis and translationally along perpendicular first and second axes. The circuit board and top probe structure motor means are operative to shift both the circuit board and the top probe structure around the vertical axis and along their first and second translational axes to effect precise alignment between the top and bottom circuit board test contact points and their associated probe members on the two probe structures.

According to a further feature of the present invention, the top probe structure and the circuit board are carried on support block structures interconnected by vertical lead screw members rotated by drive motors operatively connected thereto. Bottom portions of the lead screws have relatively closely spaced threads drivingly engaged with the circuit board support blocks, and top portions of the lead screws have relatively widely spaced threads drivingly engaged with the top probe structure support blocks. The thread pitches on the top lead screw portions are related to the smaller thread pitches on the bottom lead screw portions in a manner such that when the drive motors are actuated to vertically move the circuit board and the top probe structure to their test positions, the circuit board is driven downwardly into engagement with the bottom probe structure at which time the top probe structure downwardly reaches and operatively engages the top side of the circuit board.

BRIEF DESCRIPTION OF THE DRAWINGS

FIG. 1 is a simplified, partially cut away perspective view of a portion of an optically alignable circuit test system which embodies principles of the present invention and is utilized to electrically test the opposite sides of a printed circuit board or the like;

DETAILED DESCRIPTION

Figure 1:
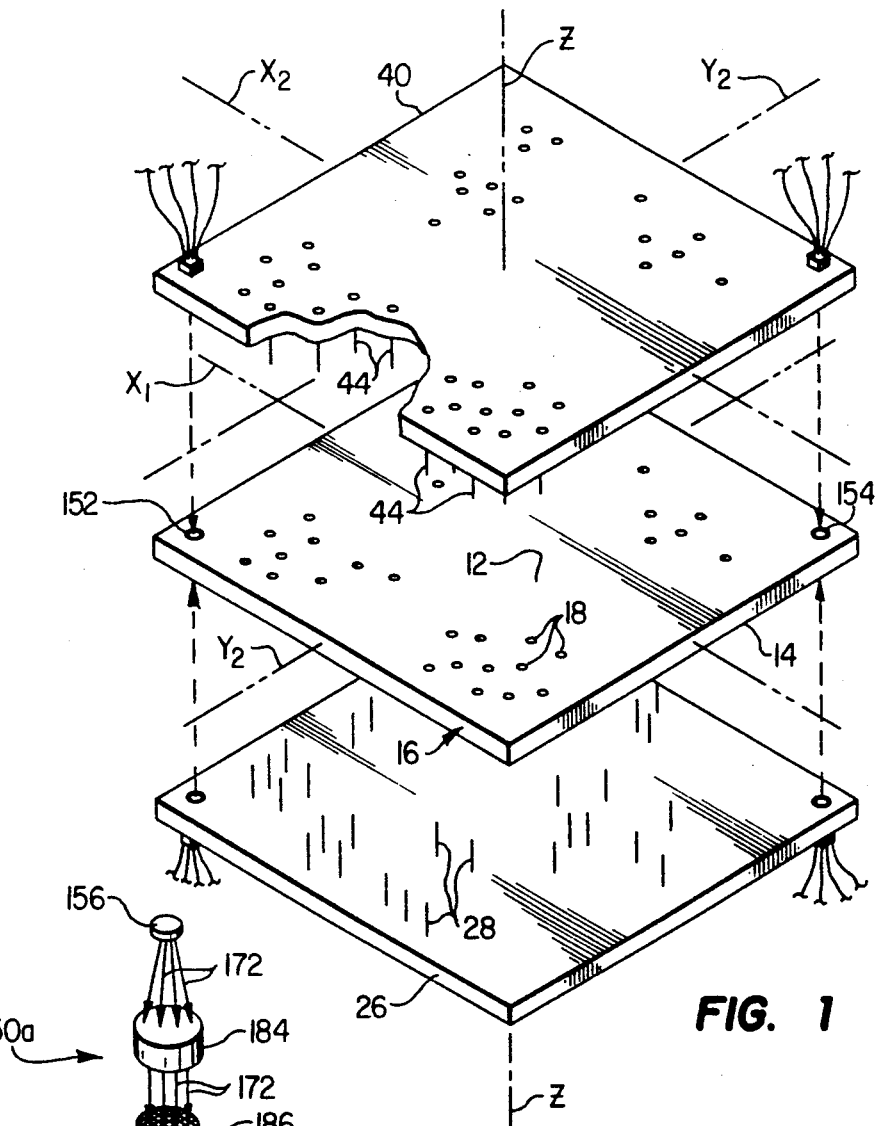
Figure 2:
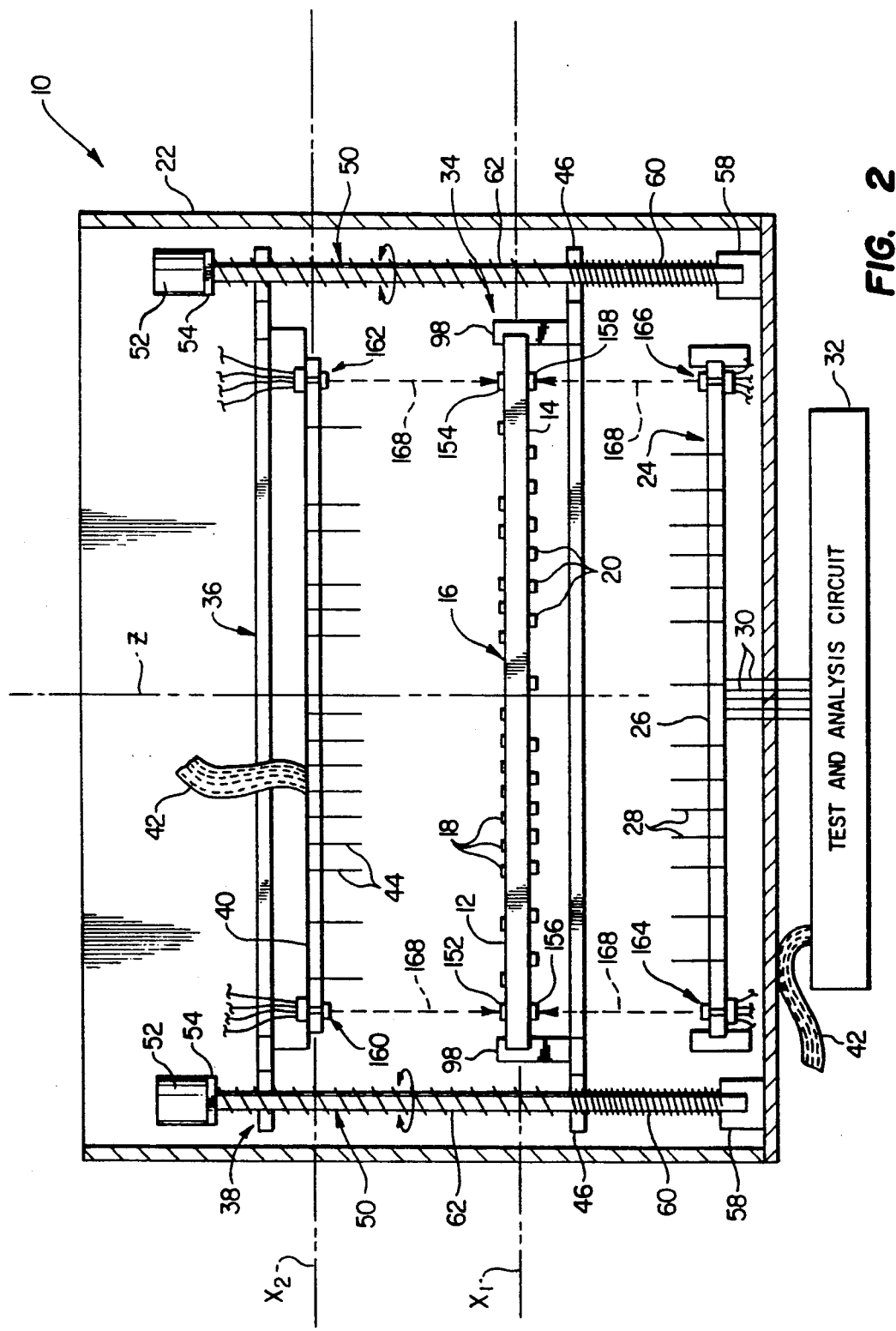
FIG. 2 is a simplified schematic cross-sectional view through the system with the components thereof in their pre-test positions.

Referring initially to FIGS. 1 and 2, the present invention provides improved electrical test fixture apparatus 10 (FIG. 2) which is utilized to simultaneously test the top and bottom sides 12 and 14 of a printed circuit board 16, the circuit board 16 having spaced series of electrically conductive test contact points or "pads" 18, 20 disposed on its top and bottom sides and operatively connected to its circuitry.

The test fixture 10 is cross-sectionally illustrated in FIG. 2 in its pre-test position and includes an outer housing or superstructure 22 having supported therein a fixed bottom probe structure 24 comprising a printed circuit probe board 26 from which a spaced series of probe members in the form of resilient, electrically conductive test pins 28 upwardly project. In a manner subsequently described, the pins 28 (commonly referred to as "pogo" pins) are horizontally alignable and operatively engageable with the bottom test contact points 20 of the circuit board 16 to be tested. By means of suitable leads 30, the bottom probe board 26 is connected to a conventional test and analysis circuit 32 which, in a manner also subsequently described, receives and analyzes electrical test signals from the circuit board contact points 18, 20.

First support means 34 are also disposed within the housing 22 and operate to hold the circuit board 16 in a parallel, upwardly spaced relationship with the probe board 24, with the bottom circuit board test contact points 20 facing and generally aligned with the bottom test pins 28. A top test probe structure 36 is carried within the housing 22, by second support means 38, above the supported circuit board 16 and includes a top printed circuit probe board 40 whose circuitry is operatively connected to the test and analysis circuit by one or more flexible printed circuit members 42. Top probe board 40 defines a bottom side portion of the top probe structure 36 and has disposed on its bottom side a spaced series of probe members in the form of resilient, electrically conductive test pins 44 similar to the bottom test pins 28. The test pins 44 are spaced upwardly apart from the circuit board top side test contact points 18, and are generally aligned and operatively engageable therewith.

Figure 3:
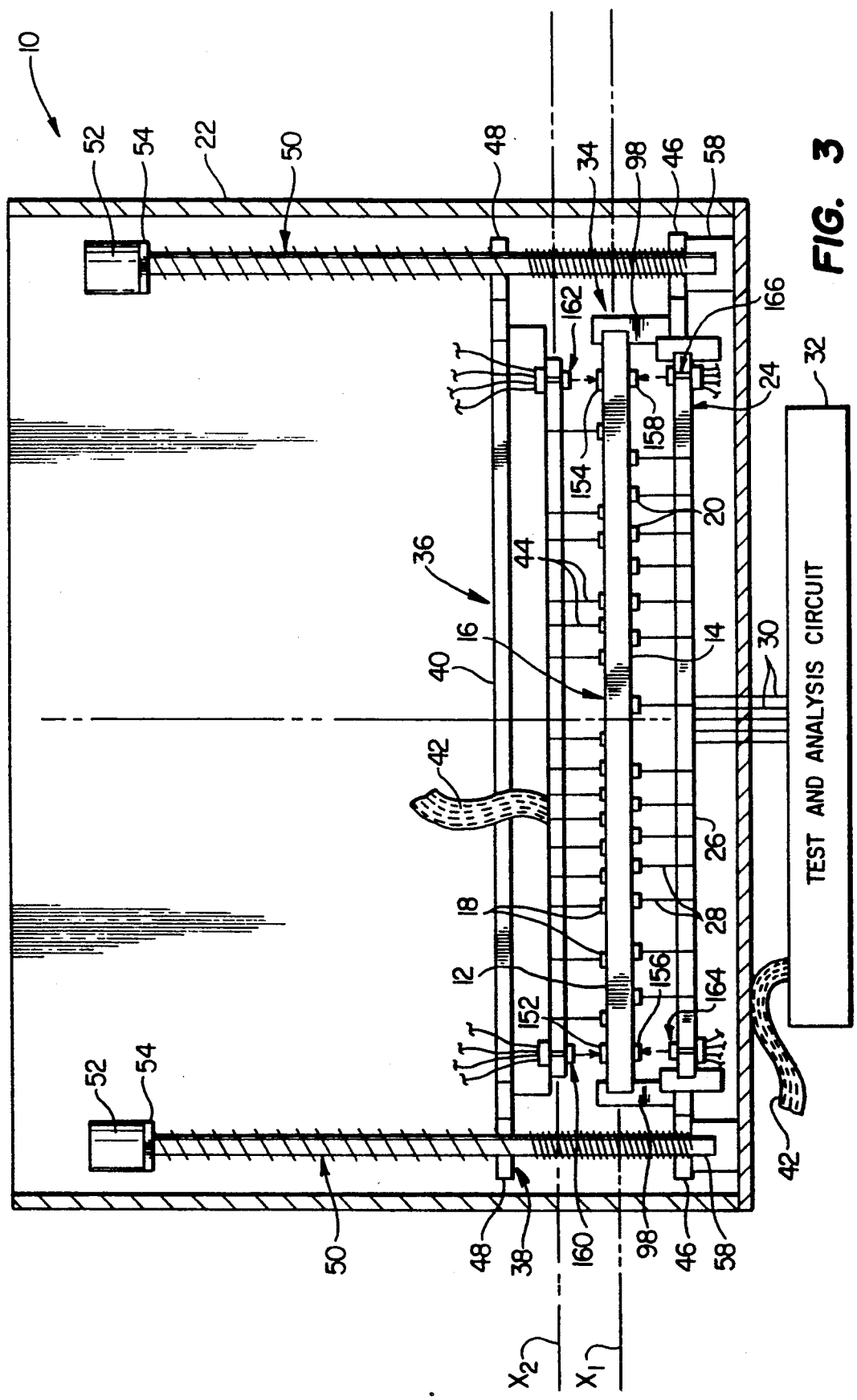
FIG. 3 is a simplified schematic cross-sectional view similar to that in FIG. 2, but with the test system components moved to their operative test positions.
Figure 4:
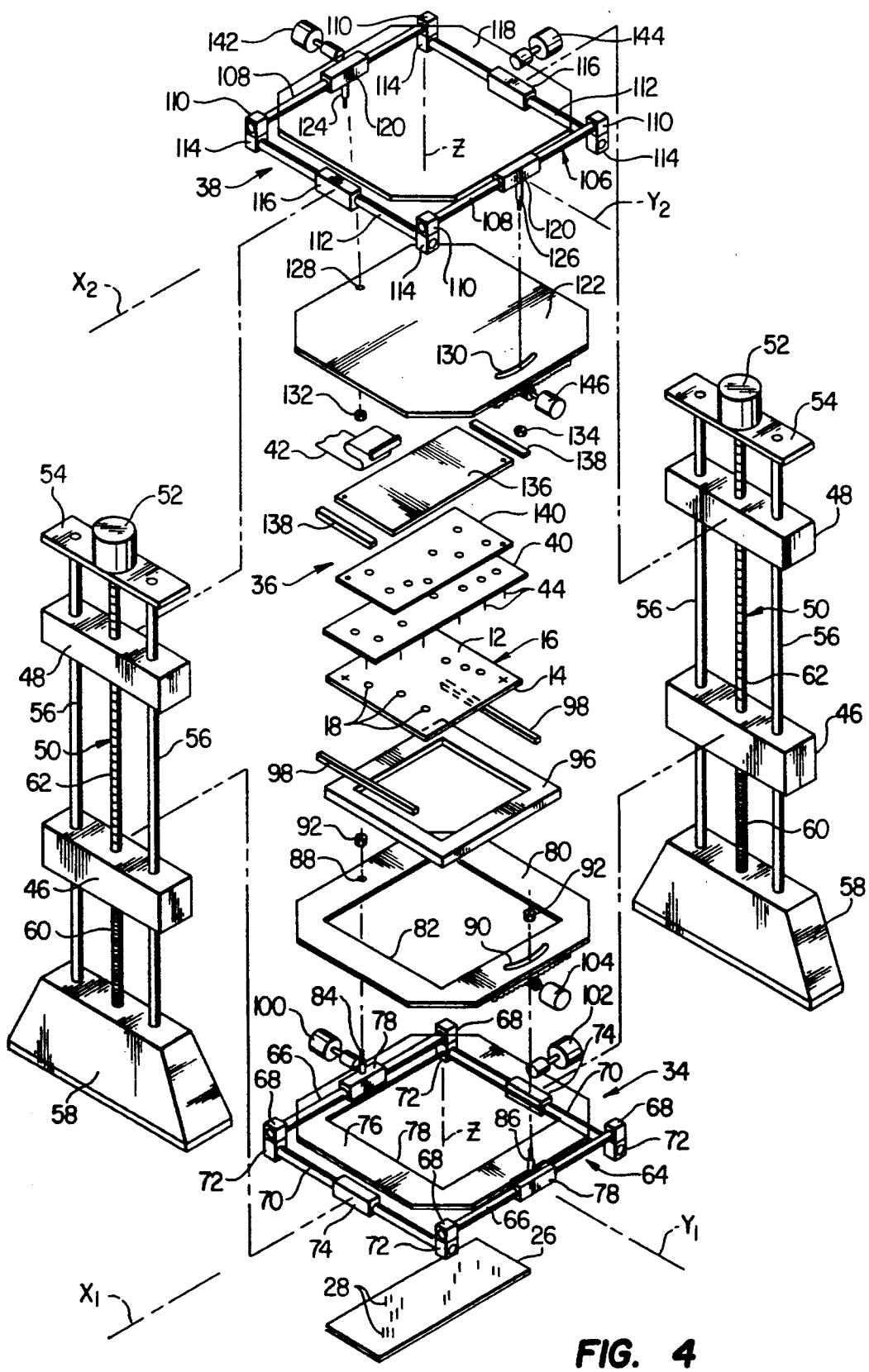
FIG. 4 is a simplified and somewhat schematic exploded perspective view of portions of the test system.

Referring now to FIGS. 2-4, the first and second support means 34, 38 are carried on their opposite sides by drive blocks 46, 48 downwardly through which a pair of lead screw members 50 threadingly extend, the lead screw members having operatively connected to their upper ends a pair of drive motors 52 which are operable to rotate the screws 50 to move the blocks 46, 48 vertically between their pre-test positions shown in FIG. 2 and their test positions shown in FIG. 3. Motors 52 are mounted on top support plates 54 which are suitably anchored to the upper ends of guide rods 56 slidably extending downwardly through the blocks 46, 48 and anchored at their lower ends to base members 58 disposed within the housing 22 on opposite sides of the bottom probe structure 24. The lower ends of the lead screws 50 are rotatably received in the top sides of the base members 58.

As illustrated, lower portions 60 of the lead screws 50 threadingly engage the drive blocks 46 and have relatively fine thread pitches, while upper portions 62 of the lead screws 50 threadingly engage the drive blocks 48 and have relatively coarse thread pitches. The thread pitches on these upper and lower lead screws are configurationally related in a manner such that when the drive motors 52 are operated to downwardly move the first and second support means 34, 38 downwardly from their FIG. 2 pre-test positions to their FIG. 3 test positions, the bottom test pins 28 are caused to operatively engage and be vertically depressed by their associated bottom circuit board test points 20 at essentially the same time that the top test pins 44 operatively engage and are vertically depressed by the top circuit board test points 18. After testing of the circuit board 16, the lead screws are simply rotated in opposite directions to return the top probe structure 36 and the circuit board 16 to their FIG. 2 pre-test positions.

With the top probe structure 36 and the circuit board 16 in their test positions, and power suitably supplied to the circuit board 16, top and bottom side test signals are transmitted to the test and analysis circuit 32 from the test contact points 18, 20 via the test pins 44, 28 and the leads 30 and the flexible printed circuit member 42. The mechanical vertical drive system just described substantially eliminates warpage of the circuit board under test, and corresponding misalignment of the test pins and their associated circuit board test contact points, caused by the conventional use of a vacuum force imposed on the circuit board under test and used to draw it downwardly to a test position thereof.

While the vertical drive system described above is operative to move the first and second support means 34, 38 downwardly from their FIG. 2 pre-test positions to their FIG. 3 test positions, it will be readily appreciated that other means and motion sequences could be utilized, if desired, to create the relative vertical movement between the first and second support means 34, 38 and the bottom probe structure 24 necessary to effect the desired test pin/pad contact. As but one example, the support means 24 could be held stationary, and the support means 38 and the bottom probe structure 24 moved vertically toward the stationary support means 34.

Referring now to FIGS. 1-4, according to a further aspect of the present invention, the circuit board 16 to be tested is carried by the first support means 34 for selective shifting relative to the bottom probe structure 24 in a first horizontal plane passing through the circuit board 16. More specifically, the circuit board 16 is carried by the first support means 34 for horizontal shifting movement rotationally about a vertical axis Z, translationally along a horizontal axis $X_1$ perpendicular to axis Z, and translationally along a horizontal axis $Y_1$ perpendicular to the axes Z and $X_1$.

In a similar manner, the top probe board 40 is carried by the second support means 38 for selective shifting relative to the circuit board 16 in a second horizontal plane passing through the board 40. More specifically, the top probe board 40 is carried by the second support means 38 for horizontal shifting movement rotationally about the vertical axis Z, translationally along a horizontal axis $X_2$ perpendicular to axis Z, and translationally along a horizontal axis $Y_2$ perpendicular to the axes Z and $X_2$.

Turning now to FIG. 4, the first support means 34 include a generally rectangular X-Y translation frame structure 64 having a first pair of opposed side rods 66 with opposite ends slidably extended through corner blocks 68, and a second pair of opposed side rods 70 with opposite ends slidably extended through corner blocks 72 anchored to the corner blocks 68. Mounting blocks 74 are slidably carried on the rods 70 and are suitably anchored to the drive blocks 46. An X-Y translation plate 76, having a central rectangular opening 78 through which the bottom test pins 28 may upwardly pass, is suitably secured to the tops of mounting blocks 78 carried on central portions of the rods 66.

A rotation plate 80, having a central rectangular opening 82 therein, is secured atop plate 76, for rotation relative thereto generally about vertical axis Z, by a pair of pivot pins 84, 86 extending upwardly through plate 76 and respectively through a circular opening 88 and an arcuate slot 90 formed through the plate 80. As indicated, the upper ends of pins 84, 86 have retaining nuts 92, 94 secured thereto.

A rectangular mounting frame plate 96 is fixedly secured in a suitable manner to the top side of plate 80 and an opposed pair of mounting channel members 98 are fixed to the top side of plate 80. The mounting channel members 98 (see FIG. 2) receive and support opposite side edge portions of the circuit board 16 to be electrically tested.

Operatively associated with the first support means 34 for vertical movement therewith are electrical stepper motors 100, 102 which are drivingly connected to the X-Y translation plate 76, and an electrical stepper motor 104 which is drivingly connected to the rotation plate 80. Operation of motor 100 serves to translate the supported circuit board 16 in selectively opposite directions relative to the bottom probe board 26 along the $X_1$ axis; operation of the motor 102 serves to translate the supported circuit board 16 relative to the bottom probe board 26 in selectively opposite directions relative to the bottom probe board 26 along the $Y_1$ axis; and operation of motor 104 serves to rotate the supported circuit board 16 relative to the bottom probe board 26 about pin 84 (i.e., generally about axis Z).

The second support means 38 include a generally rectangular X-Y translation frame structure 106 having a first pair of opposed side rods 108 with opposite ends slidably extended through corner blocks 110, and a second pair of opposed side rods 112 with opposite ends slidably extended through corner blocks 114 anchored to the corner blocks 110. Mounting blocks 116 are slidably carried on the rods 112 and are suitably anchored to the drive blocks 48. An X-Y translation plate 118 is suitably secured to the tops of mounting blocks 120 carried on central portions of the rods 108.

A rotation plate 122 is mounted beneath frame 106 for rotation relative thereto generally about vertical axis Z by a pair of pivot pins 124, 126 extending downwardly from blocks 120 and respectively through a circular opening 128 and an arcuate slot 130 formed through the plate 122. As indicated, the lower ends of pins 124, 126 have retaining nuts 132, 134 secured thereto.

The top probe structure 36, as schematically depicted in FIG. 4, includes a printed circuit transfer board 136 carried in support channels 138 anchored to the underside of plate 122 and operatively connected to the flexible printed circuit member 42. The top probe board 40 is also fixedly mounted beneath the plate 122, and an intermediate printed circuit transfer board 140 is sandwiched between boards 40 and 136. The boards 136 and 140 are combinatively operative to transmit electrical test signals received by the test pins 44 to the flexible printed circuit member 42.

Operatively associated with the second support means 38 for vertical movement therewith are electrical stepper motors 142, 144 which are drivingly connected to the X-Y translation plate 118, and an electrical stepper motor 146 which is drivingly connected to the rotation plate 122. Operation of motor 142 serves to translate the supported top probe board 40 in selectively opposite directions relative to the supported circuit board 16 along the $X_2$ axis; operation of the motor 144 serves to translate the top probe board 40 in selectively opposite directions relative to the circuitry board 16 along the $Y_2$ axis; and operation of motor 146 serves to rotate the top probe board 40 about pin 124 (i.e., generally about axis Z).

Figure 5:
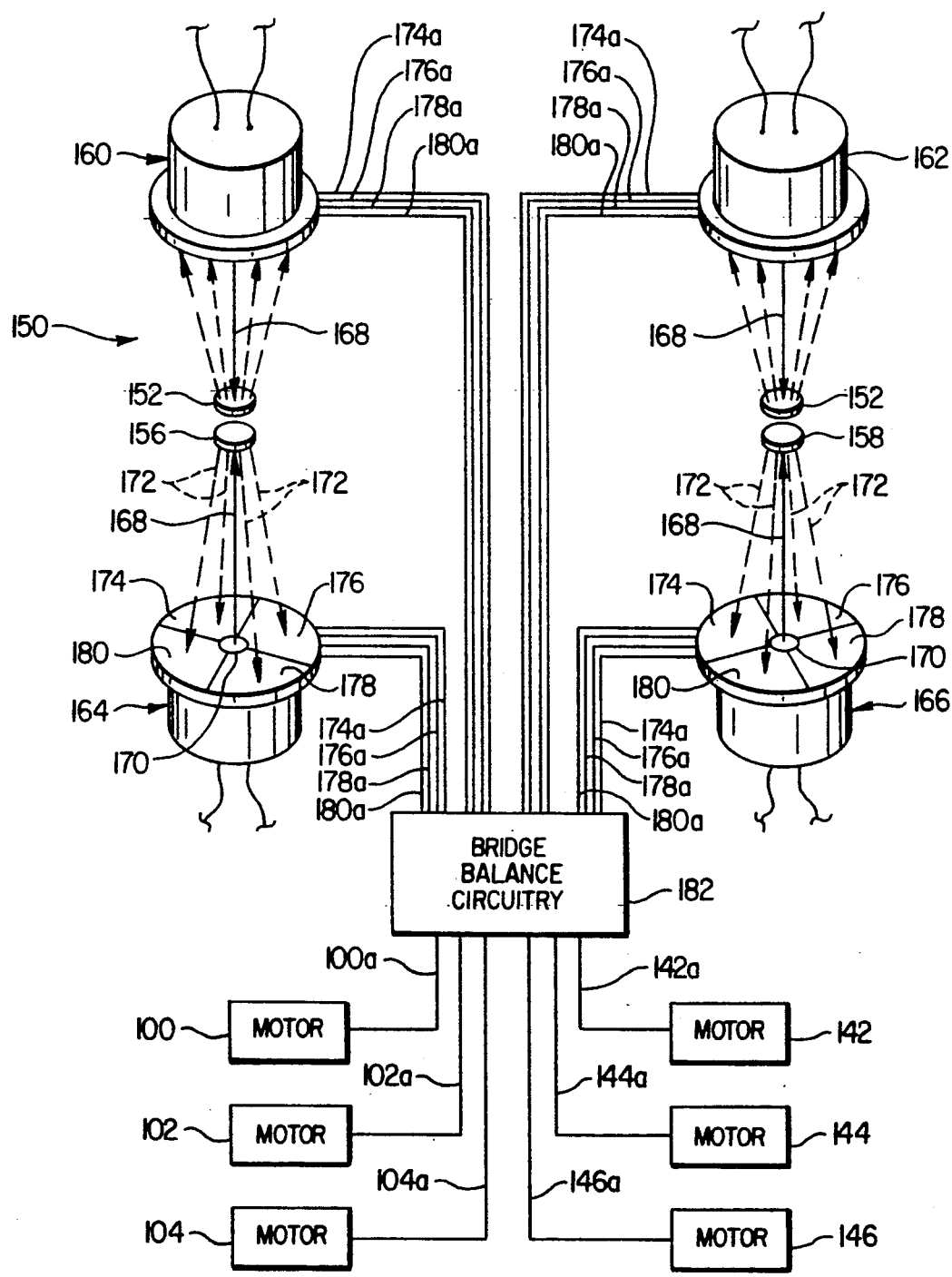
FIG. 5 is a schematic circuit diagram illustrating an analog optical positioning system used to achieve precise relative positioning between a printed circuit board being tested and upper and lower pogo pin-based probe structures used to effect the electrical testing of the circuit board.

Referring now to FIGS. 1, 2 and 5, according to an important feature of the present feature of the present invention, in one embodiment thereof, the test fixture 10 is provided with an analog optical positioning sensing system 150 (FIG. 5) which is utilized to optically sense horizontal misalignments between the top and bottom test pins 44, 28 and their associated top and bottom circuit board test contact points 18, 20 and responsively control the stepper motors 100, 102, 104, 142, 144 and 146 in a manner essentially eliminating such mis-alignments.

The sensing system 150 includes two spaced apart reflective target fiducial members 152, 154 mounted on the top side 12 of the supported circuit board 16; two spaced apart reflective target fiducial members 156, 158 mounted on the bottom side 14 of the circuit board 16; a pair of conventional four-quadrant photoconductor assemblies 160, 162 mounted on the top probe board 40 respectively above the target fiducials 152, 154; and a pair of conventional four-quadrant photoconductor assemblies 164, 166 mounted on the bottom probe board 26 respectively beneath the target fiducials 156, 158.

During operation of the sensing system 150, with the components of the test fixture 10 in their FIG. 2 pre-test positions, beams of light 168 are vertically transmitted through central apertures 170 in the four photoconductor assemblies and caused to strike their associated target fiducial members. Light 172 reflected from each of the fiducials strikes four sensing quadrant areas 174, 176, 178 and 180 on its associated photoconductor assembly. Extending from each photoconductor assembly 160, 162, 164, 166 is a four wire lead set $174_a$, $176_a$, $178_a$, $180_a$ (FIG. 5) which is connected to schematically depicted bridge balance circuitry 182.

The lower photoconductor assembly/target fiducial set 164, 166 and 156, 158 are positioned on the bottom probe board 26 and the circuit board 16 in a manner such that if the centerlines of the apertures 170 of the photoconductor assemblies 164, 166 are precisely aligned with the centers of the target fiducials 156 and 158, the bottom test pins 28 are in precise horizontal alignment with their associated test contact points 20 on the bottom side 14 of the circuit board 16.

In a similar manner, the upper photoconductor/target fiducial set 160, 162 and 152, 154 are positioned on the top probe board 40 and the top side of the circuit board 16 in a manner such that if the centerlines of the apertures 170 of the photoconductor assemblies 160, 162 are precisely aligned with the centers of the target fiducials 152 and 154, the top test pins 44 are in precise horizontal alignment with their associated test contact points 18 on the top side 12 of the circuit board 16.

When a precise horizontal alignment exists between the top side test contact points 18 and the top test pins 44, and between the bottom side test contact points 20 and the bottom test pins 28, each photoconductor assembly sensing quadrant receives the same amount of reflected light 172 as the other three quadrants on the particular assembly do, and equal received light intensity output signals are transmitted to the bridge balance circuitry 182 through each of the assembly's four output leads $174_a$, $176_a$, $178_a$ and $180_a$.

However, if the bottom test contact points 20 are horizontally shifted out of precise alignment with the bottom test pins 28, rotationally about axis Z and/or translationally along either horizontal axis $X_2$ of $Y_2$, a corresponding imbalance is created among the magnitudes of reflected light 172 received by the four quadrants of each of the photoconductors 164, 166. This imbalance in quadrant-received reflected light causes corresponding differences in the magnitudes of the output signals transmitted to the bridge balance circuitry 182 via the lead wires $174_a$, $176_a$, $178_a$ and $180_a$ of each of the assemblies 164, 166. As will be readily appreciated, the relative magnitudes of these output signals are collectively indicative of the magnitude and sense of horizontal misalignment between the bottom test pins 28 and the bottom side test contact points 20 generally about the Z axis and along the horizontal axes $X_2$ and $Y_2$.

The bridge balance circuitry 182 functions to compare the output signal magnitudes in the four leads $174_a$, $176_a$, $178_a$ and $180_a$ from each of the photoconductor assemblies 164 and 166, determine the direction and magnitude of horizontal shifting required for each of the target fiducials 156, 158 to bring the bottom side test contact points 20 back into precise horizontal alignment with the bottom test pins 28, and, as necessary, outputs drive signals $100_a$, $102_a$ and $104_a$ to the stepper motors 100, 102 and 104 to automatically eliminate the optically sensed misalignment.

The upper photoconductor assembly/target fiducial set 160, 162 and 152, 154 operate in the same manner as the lower photoconductor assembly/target fiducial set to optically sense and automatically correct a horizontal misalignment between the top test pins 44 and the top side test contact points 18. Specifically, the bridge balance circuitry 182 functions to compare the four output signal magnitudes in each of the lead sets $174_a$, $176_a$, $178_a$ and $180_a$ from the photoconductor assemblies 160, 162 and, as necessary, transmit drive signals $142_a$, $144_a$ and $146_a$ to the upper stepper motors 142, 144 and 146 to correctively shift the top probe board 40 generally about the Z axis and/or along the $X_1$ and $X_1$ axes.

It will be readily appreciated by those skilled in the test fixture are that the optical position sensing and corrective shifting just described may be carried out before the first and second support means 34 and 38 are downwardly driven from their FIG. 2 pre-test positions to their FIG. 3 test positions, or intermittently or continuously during their downward movement toward such positions. It will also be readily understood that while various principles of the present invention have been illustratively embodied in a test fixture 10 adapted to simultaneously test the opposite sides of a printed circuit board or the like, they could also be advantageously incorporated into a test fixture adapted to test only the top or bottom side of a circuit board operatively supported therein.

Figure 6:
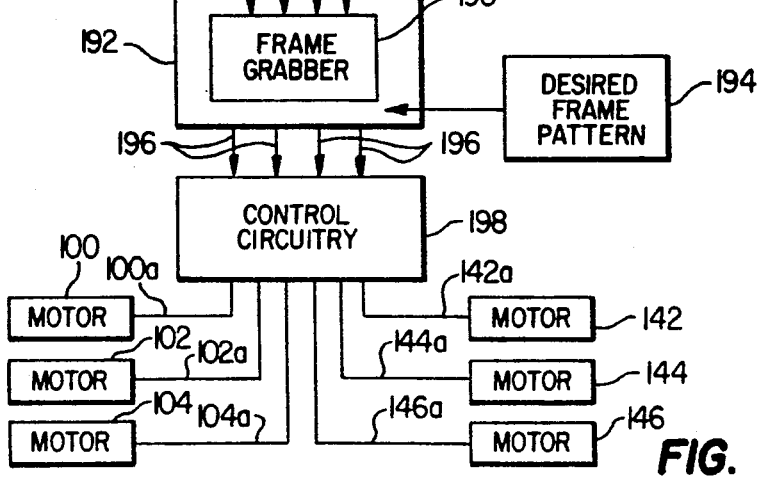
FIG. 6 is a schematic circuit diagram illustrating a portion of an alternate digital embodiment of the optical positioning system depicted in FIG. 5.

A portion of an alternate digital embodiment $150_a$ of the optical sensing system 150 described above is schematically depicted in FIG. 6 and operates essentially in the same manner except that each of the four photoconductor assemblies is replaced by a camera lens 184 (only one of which is illustrated) mounted on the bottom probe board 26, or the top probe board 40 as the case may be, in a facing relationship with an associated reflective target fiducial such as the fiducial 156 shown in FIG. 6. Light 172 reflected from each fiducial is passed through its associated lens, and through a multi-pixel transducer associated with the lens and operative to output a video signal 188 indicative to the horizontal position of the target fiducial relative to its associated lens.

The four video output signals 188 from the four lens/transducer sets are transmitted to a conventional frame grabber 190 disposed within a computer 192 and operative to convert the video signals 188 to positional "frames" indicative of the actual positions of the four target fiducials relative to their associated lenses. A desired frame pattern 194, indicative of a frame pattern transmitted from each transducer 186 which is indicative of proper horizontal positioning of its associated target fiducial, is suitably programmed into the computer's memory.

The computer 192 is programmed to compare the four frames generated by the frame grabber 190 (each indicative of the horizontal position of one of the four fiducials), compare them to the desired frame pattern 194, and responsively generate output signals 196 each indicative of the magnitude and net direction of horizontal misalignment of one of the four target fiducials. The four digital output signals 196 are transmitted to schematically depicted control circuitry 198 which, as needed, responsively transmits drive signals $100_a$, $102_a$, $104_a$, $142_a$, $144_a$ and $146_a$ to the stepper motors 100, 102, 104, 142, 144 and 146 to horizontally realign the upper and lower test contact points 18, 20 with their associated top and bottom test pins 44, 28.

The alignment sensing and adjustment systems just described advantageously eliminate the test fixture alignment problems resulting in conventional systems utilizing tooling pins to horizontally position the circuit board to be tested. As is well known, the eventual side surface wear experienced by the tooling pins createes a looser and looser fit between such pins and the circuit board openings which receive them. Such progressively looser fit creates progressively greater horizontal misalignment between the circuit board to be tested and the associated electrical test probe members. In the manner just described, the present invention provides for automatic sensing and correction of such misalignment. Accordingly, the test fixture user no longer has to rely on one-time mechanical alignment via tooling pins.

However, if desired, tooling pins can still be used to support the circuit board to be tested within the test fixture and keep it in general alignment with its associated test probe members, with the optical sensing and adjustment system providing "fine tuning" of the critical contact point/probe member alignment.

In the embodiments 150, $150_a$ of the alignment sensing and adjustment system described above, the top and bottom probe structures 36 and 24 incorporated therein test probe members in the form of conventional pogo pins. According to a further feature of the present invention, shown in FIG. 7, alternate embodiments $24_a$ and $36_a$ of the bottom and top probe structures 24 and 36 are provided in which the pogo pins are replaced with small resilient silver (or other suitable metal) contact members 200, 202 and 204 respectively positioned in horizontally spaced apart series imbedded in relatively thin resilient pads 206, 208 and 210, FIG. 7 cross-sectionally depicting a portion of the test fixture with the aforementioned first and second support means in their test positions.

Figure 7:
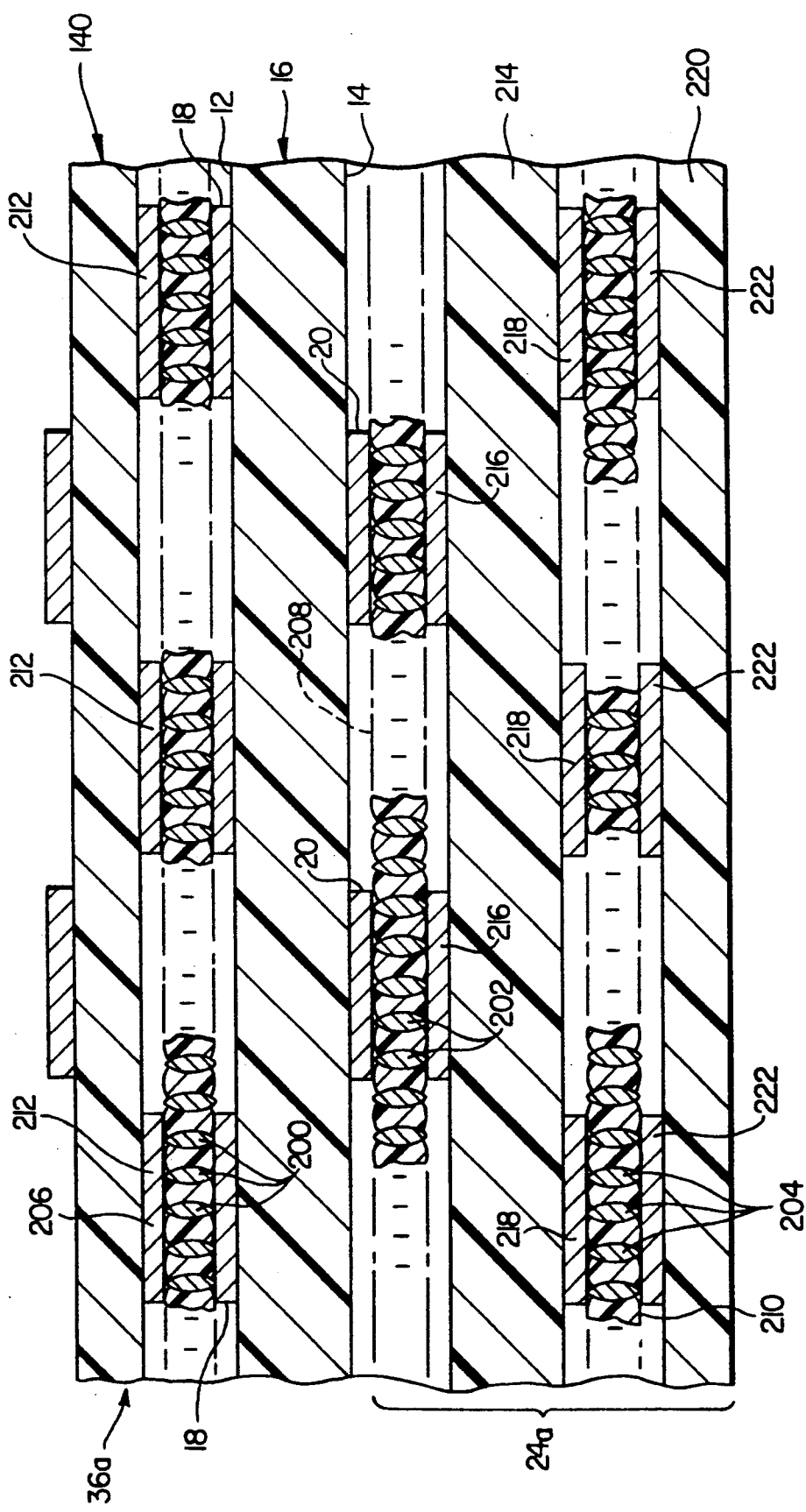
FIG. 7 is an enlarged scale partial cross-sectional view through the test system, with its components in their operative test positions, and illustrates an alternate resilient pad embodiment of the upper and lower test probe portions of the system.

In the modified top probe structure $36_a$ the pad 206 is suitably secured to the underside of the intermediate circuit board 40 in place of the top probe board 40. The top and bottom ends of the imbedded contact members 200 are generally pointed and are exposed along the top and bottom sides of pad 206. As illustrated in FIG. 7, with the fixture components in their test positions, the pad 206 is slightly compressed between the top test contact points 18 of the circuit board 16 and bottom side contact points 212 on the intermediate board 140 which are horizontally aligned with the test contact points 18. The imbedded contact members 200 are sufficiently closely spaced so that, as indicated, several of them are engaged by and slightly compressed between facing pairs of contact points 18, 212. This feature advantageously diminishes the criticality of extremely precise horizontal alignment between the top probe structure $36_a$ and the circuit board 16.

From top to bottom the modified bottom probe structure $24_a$ includes the resilient pad 208; a top printed circuit transfer board 214 having a spaced series of top side surface contact points 216 positioned thereon and horizontally aligned with the bottom test contact points 20, and a spaced series of bottom side surface contact points 218; the resilient pad 210; and a bottom printed circuit transfer board 220 operatively connected to the test and analysis circuit 32 (FIG. 3) and having a spaced series of top side surface contact points 222 horizontally aligned with the bottom side surface contact points 218 of board 214.

With the fixture components in their test positions shown in FIG. 7, the pad 208 is compressed between 20 and 216, and the pad 210 is compressed between contact points 218 and 222, groups of contact members 202 electrically connect facing pairs of contact points 20 and 216, and groups of contact members 204 electrically connect facing pairs of contact points 218 and 222. In this manner, the bottom probe structure $24_a$ provides contact resiliency and redundancy in the same fashion as the modified top probe structure $36_a$.

The foregoing detailed description is to be clearly understood as being given by way of illustration and example only, the spirit and scope of the present invention being limited solely by the appended claims.

What is claimed is:

1. Electrical test fixture apparatus for simultaneously testing the bottom and top sides of a circuit board having first and second spaced series of electrically conductive test contact points disposed on said bottom and top sides, respectively, said electrical test fixture apparatus comprising:

a bottom probe structure having a top side portion through which a vertical axis extends, said top side portion having a spaced series of electrically conductive first probe members positioned thereon and being alignable and operatively engageable with said first series of test contact points;

a top probe structure having a bottom side portion facing said bottom probe structure top side portion and spaced upwardly apart therefrom along said vertical axis, said bottom side portion having a spaced series of electrically conductive second probe members positioned thereon and being alignable and operatively engageable with said second series of test contact points;

first support means for supporting said top probe structure for selective shifting thereof relative to said bottom probe structure in a first horizontal plane passing through said top probe structure;

second support means for supporting said circuit board between said top and bottom probe structures, with said first and second series of test contact points respectively facing said first and second probe members and being vertically spaced apart therefrom, for selective shifting of the supported circuit board relative to said bottom probe structure in a second horizontal plane passing through the supported circuit board;

first alignment adjustment means for optically sensing a misalignment between said first probe members and said first series of test contact points and automatically shifting the supported circuit board in said second horizontal plane to bring said first probe members and said first series of test contact points into precise horizontal alignment with one another;

seond alignment adjustment means for optically sensing a misalignment between said second probe members and said second series of test contact points and automatically shifting said top probe structure in said first horizontal plane to bring said second probe members and said second series of test contact points into precise horizontal alignment with one another; and drive means for creating relative vertical movement between said first support means, said second support means and said bottom probe structure in a manner creating an operative engagement between the aligned first probe members and first series of test contact points, and creating an operative engagement between the aligned second probe members and second series of test contact points, said drive means including:

vertical lead screw means threadingly engaging said first and second support means and being operatively rotatable to downwardly translate said first and second support means in a manner essentially simultaneously bringing said first series of test contact points into contact with said first probe members, and said second series of test contact points into contact with said second probe members, and means for operatively rotating said vertical lead screw means.

2. The electrical test fixture apparatus of claim 1 wherein:

said top side portion of said bottom probe structure includes a first resilient pad member, said first probe members are first resilient metal members imbedded in said first pad member, said bottom side portion of said top probe structure includes a second resilient pad member, and said second probe members are second resilient metal members imbedded in said second pad member.

3. The electrical test fixture apparatus of claim 2 wherein said bottom probe structure further includes:

a first printed circuit transfer board disposed beneath said first resilient pad and having top side surface contact points engaging groups of said first resilient metal members and aligned with said first test contact points, and bottom side surface contact points, a third resilient pad member disposed beneath said first printed circuit transfer board and having a spaced series of third resilient metal members imbedded therein, groups of which engage said bottom side surface contact points of said first printed circuit transfer board, a second printed circuit transfer board connectable to an electrical test and analysis circuit, said second printed circuit transfer board being positioned beneath said third resilient pad member and having top side surface contact points aligned with said bottom side surface contact points of said first printed circuit transfer board and engaging groups of said third resilient metal members.

4. The electrical test fixture apparatus of claim 1 wherein:
said first and second probe members are resilient test pin members.

5. The electrical test fixture apparatus of claim 1 wherein:
said first alignment adjustment means include a spaced plurality of first reflective target fiducial members secured to the bottom side of said circuit board, and a spaced plurality of first light receiving means secured to said top side portion of said bottom probe structure for receiving light reflected from said first reflective target fiducial members and utilizing such reflected light to generate first output signals indicative of the horizontal position of said first reflective target fiducial members relative to said first light receiving means, and
said second alignment adjustment means include a spaced plurality of second reflective target fiducial members secured to the top side of said circuit board, and a spaced plurality of second light receiving means secured to said bottom side portion of said top probe structure for receiving light reflected from said second reflective target fiducial members and utilizing such reflected light to generate second output signals indicative of the horizontal position of said second reflective target fiducial members relative to said second light receiving means.

6. The electrical test fixture apparatus of claim 5 wherein:
said first alignment adjustment means are operative to utilize said first output signals to shift said circuit board relative to said bottom probe structure rotationally generally about a vertical axis and translationally along first and second horizontal axes perpendicular to one another and to said vertical axis, and
said second alignment adjustment means are operative to utilize said second output signals to shift said top probe structure relative to said circuit board rotationally generally about said vertical axis and translationally along third and fourth horizontal axes perpendicular to one another and to said vertical axis.

7. The electrical test fixture apparatus of claim 5 wherein:
said first and second light receiving means are four-quadrant photoconductor assemblies.

8. The electrical test fixture apparatus of claim 7 wherein said first and second alignment adjustment means include:
means for transmitting output signals from each of said photoconductor assemblies which are indicative of the amount of reflected light received by each of its quadrants,
motor means operable to shift said top probe structure in said first horizontal plane, and to shift the supported circuit board in said second horizontal plane, and
bridge balancing circuitry means for receiving said output signals and responsively transmitting drive signals to said motor means to operate said motor means.

9. The electrical test fixture apparatus of claim 5 wherein said first and second light receiving means each includes:
lens means for receiving and transmitting light reflected from one of said target fiducial members, and
multi-pixel transducer means for receiving the light transmitted from said lens means and converting it to a video output signal.

10. The electrical test fixture apparatus of claim 9 wherein said first and second alignment adjustment means include:
computer means having frame grabber means incorporated therein for receiving said video output signals and converting them to frame patterns indicative of the horizontal positions of said target fiducial members relative to their associated lens means, said computer means having stored in the memory thereof reference frame patterns corresponding to the desired horizontal positions of said target fiducial members relative to their associated lens means, said computer means being operative to transmit output signals indicative of a horizontal misalignment between one or more of said target fiducial members and their associated lens means.

11. The electrical test fixture apparatus of claim 10 wherein said first and second alignment adjustment means further include:
motor means operable by said computer means output signals to shift said top probe structure in said first horizontal plane, and to shift the supported circuit board in said second horizontal plane.

12. The electrical test fixture apparatus of claim 1 wherein:
said first alignment adjustment means are operative to shift the supported circuit board rotationally generally about a vertical axis, and translationally along first and second horizontal axes transverse to said vertical axis, and
said second alignment adjustment means are operative to shift said top probe structure rotationally generally about said vertical axis, and translationally along third and fourth horizontal axes transverse to said vertical axis.

13. The electrical test fixture apparatus of claim 1 wherein:
said drive means are operative to generally simultaneously create said operative engagement between the aligned first probe members and first series of test contact points, and said operative engagement between the aligned second probe members and second series of test contact points.

14. Electrical test fixture apparatus for simultaneously testing the bottom and top sides of a circuit board having first and second spaced series of electrically conductive test contact points disposed on said bottom and top sides, respectively, said electrical test fixture apparatus comprising:
a bottom probe structure having a top side portion with a spaced series of electrically conductive first probe members positioned thereon and being alignable and operatively engageable with said first series of test contact points;

a top probe structure having a bottom side portion facing said bottom probe structure top side portion and spaced upwardly apart therefrom, said bottom side portion having a spaced series of electrically conductive second probe members positioned thereon and being alignable and operatively engageable with said second series of test contact points;

support means having vertically movable first and second portions for respectively supporting said top probe structure and said circuit board in pre-test positions in which:
(1) said bottom side of said circuit board faces and is spaced upwardly apart from said top side portion of said bottom probe structure, with said first series of test contact points being horizontally aligned with said first probe members, and
(2) said bottom side portion of said top probe structure faces and is spaced upwardly apart from said top side of said circuit board, with said second probe members being horizontally aligned with said second series of test contact points; and drive means for downwardly moving said first and second portions of said support means, from said pre-test positions thereof, in a manner essentially simultaneously creating an operative engagement between said first probe members and said first series of test contact points, and an operative engagement between said second probe members and said second series of test contact points, said drive means including:
lead screw means extending vertically through and threadingly engaging said first and second portions of said support means, and
motor means selectively operable to rotationally drive said lead screw means relative to said first and second portions of said support means.

15. The electrical test fixture apparatus of claim 14 wherein said lead screw means include:
a plurality of vertical lead screw members each having an upper portion threadingly engaging said first portion of said support means, and a lower portion threadingly engaging said second portion of said support means, the thread pitch of each upper lead screw member portion being substantially greater than the thread pitch of its lower portion.

16. Electrical test fixture apparatus for simultaneously testing the opposite first and second sides of a circuit board having a spaced series of first test contact points on said first side, and a spaced series of second test contact points on said second side, said electrical test fixture apparatus comprising:
a first probe structure having a probe side from which a spaced series of electrically conductive first probe members outwardly project, said first probe members being alignable and operatively engageable with said first test contact points;

a second probe structure having a probe side from which a spaced series of electrically conductive second probe members outwardly project, said second probe members being alignable and operatively engageable with said second test contact points;

means for supporting said circuit board, said first probe structure, and said second probe structure in a manner such that said circuit board is interposed between and spaced apart from said first and second probe structures, with said first side of said circuit board facing said probe side of said first probe structure, and said second side of said circuit board facing said probe side of said second probe structure;

means for detecting a misalignment between said first probe members and said first test contact points and creating a corrective relative shifting between said first probe structure and said circuit board to create a more precise alignment between said first probe members and said first test contact points;

means for detecting a misalignment between said second probe members and said second test contact points and creating a corrective relative shifting between said second probe structure and said circuit board to create a more precise alignment between said second probe members and said second test contact points; and means, including rotationally drivable lead screw members threadingly engaged with portions of said means for supporting, for moving two of said circuit board, said first probe structure and said second probe structure toward the remaining one of said circuit board, said first probe structure and said second probe structure in manner essentially simultaneously bringing said first and second probe members into respective contact with said first and second test contact points.

17. The electrical test fixture apparatus of claim 16 wherein:
said lead screw members have first threaded portions threadingly engaged with first portions of said means for supporting, and second threaded portions threadingly engaged with second portions of said means for supporting, said first threaded portions having thread pitches different from those of said second threaded portions.

18. The electrical test fixture apparatus of claim 17 further comprising motor means for rotationally driving said lead screw members.

19. The electrical test fixture apparatus of claim 18 wherein:
said lead screw members, when rotationally driven by said motor means, are operative to drive said circuit board and said first probe structure toward said second probe structure.

* * * * *